United States Patent [19]

Iwamatsu

[11] Patent Number: 4,476,442

[45] Date of Patent: Oct. 9, 1984

[54] AMPLIFIER WITH DISTORTION CANCELLATION

[75] Inventor: Masayuki Iwamatsu, Hamamatsu, Japan

[73] Assignee: Nippon Gakki Seizo Kabushiki Kaisha, Japan

[21] Appl. No.: 361,203

[22] Filed: Mar. 24, 1982

[30] Foreign Application Priority Data

| Apr. 3, 1981 | [JP] | Japan | 56-50070 |
| Apr. 3, 1981 | [JP] | Japan | 56-50071 |
| Apr. 3, 1981 | [JP] | Japan | 56-50072 |
| Apr. 3, 1981 | [JP] | Japan | 56-50074 |
| Apr. 3, 1981 | [JP] | Japan | 56-50075 |

[51] Int. Cl.³ .......................... H03F 1/26; H03F 3/26
[52] U.S. Cl. .................................... 330/265; 330/293
[58] Field of Search ................ 330/149, 265, 277, 81, 330/85, 293

[56] References Cited

U.S. PATENT DOCUMENTS 3,825,854  7/1974  Pichal ................................. 330/149
4,306,199 12/1981  Kondou ............................. 330/208

FOREIGN PATENT DOCUMENTS 0010050  1/1977  Japan .................................. 330/149
0037750  3/1977  Japan .................................. 330/149

Primary Examiner—James B. Mullins
Assistant Examiner—Steven J. Mottola
Attorney, Agent, or Firm—Darby & Darby

[57] ABSTRACT

An amplifier with substantially no distortion is provided, the amplifier having input and output terminals and an amplification means for amplifying an input signal applied to the amplification means. A distortion detection circuit is provided for detecting distortion generated in the amplification means in accordance with the input and output signals of the amplification means. The output of the distortion detection circuit is applied to an addition circuit where the output of the distortion detection circuit is added to an input signal applied to the input terminal of the amplifier. The added signal is then supplied as the input signal of the amplification means for the cancellation of distortion generated in the amplification means.

10 Claims, 22 Drawing Figures

DISTORTION DET. & AMP. CKT

AMPLIFIER WITH DISTORTION CANCELLATION

BACKGROUND OF THE INVENTION (a) Field of the Invention

The present invention relates to amplifiers, and more specifically amplifiers with substantially no distortion wherein distortion generated in the amplifier is detected and added to an input signal to be amplified, for cancellation of distortion in such amplifier.

(b) Description of the Prior Art

It is known in the art that an input signal of such as class-B amplifiers under a fixed bias operation is subjected to distortion if the output signal is assumed to be free of distortion.

Shown illustratively in FIG. 1 is an amplifier circuit 7 of a class-B push-pull type, wherein NPN and PNP type transistors 3 and 4 with emitter resistors 5 and 6 (having the same value $R_E$) are supplied with bias current from respective bias sources 1 and 2. The relation between the emitter current $I_E$ (or collector current $I_C$) and the base-emitter voltage $V_{BE}$ of each transistor is shown in FIG. 2 as curves a and b which have exponential characteristic function. The curve a is representative of a relation between the emitter current $I_E$ (whose value is $I_{E1}$) and the base-emitter voltage $V_{BE}$ (whose value is $V_{BEN}$) of the transistor 3, while the curve b is representative of a relation between the emitter current $I_E$ (whose value is $I_{E2}$) and the base-emitter voltage $V_{BE}$ (whose value is $V_{BEP}$) of the transistor 4. A straight line c is also shown in FIG. 2 which indicates an ideal linear relation between the emitter currents and the base-emitter voltages. Assuming that the output current $I_0$ appearing at an output terminal 8 has no distortion and changes by $\Delta I_0$, each of the base-emitter voltages $V_{BEN}$ and $V_{BEP}$ is changes by $\Delta V_{BEN}$ and $\Delta V_{BEP}$, respectively, and is distorted due to the above-mentioned exponential characteristics of the transistors 3 and 4. Therefore, the voltage $e_i$ of an input signal 10 at an input terminal 9 is distorted by $(\Delta V_{BEN} - \Delta V_{BEP})$. Further, in this case, the voltage $R_E \cdot I_{E1}$ and $R_E \cdot I_{E2}$ delivered across each emitter resistor 5 and 6 of the respective transistors 3 and 4 are also distorted due to the exponential characteristics. As a result, assuming that when the output current $I_0$ changes by $\Delta I_0$, the emitter currents $I_{E1}$ and $I_{E2}$ are changed by $\Delta I_{E1}$ and $\Delta I_{E2}$, respectively, and that each current gain $h_{FE}$ of transistors 3 and 4 is linear, the input current $I_i$ of the input signal 10 is distorted by $\Delta I_{E1}/h_{FE}$ and $\Delta I_{E2}/h_{FE}$. Thus, both the input voltage and current $e_i$ and $I_i$ are subjected to distortion.

It is customary in the art to employ a Darlington configuration to each transistor 3 and 4 to perform the distortion reduction of the driving current $I_i$. Apart from this, in order to reduce the distortion of the driving voltage $e_i$, it is necessary to provide charging and discharging currents for the parallel capacitance at the developing portion of the distortion, that is, at the inputs of each transistor 3 and 4. Charging and discharging currents through the capacitance, however, cause to distort the driving current $I_i$. More concrete description of such a case is given with reference to FIG. 3, wherein a main portion of the amplifier circuit 7 is illustrated with the transistor 3 is FIG. 1 replaced by three transistors $3a$ through $3c$ in a Darlington connection. In the amplifier circuit 7, it is assumed that the value of a capacitance 11 produced between the base of the transistor $3a$ and ground is 47 pF, the value of a load resistor 12 connected between the output terminal 8 and ground is $8\Omega$, and the current gain $h_{FE}$ of each transistor is 100. At this condition, if the peak value of the output current $I_0$ of 10 A at 100 kHz is desired, then the peak value of the base current $I_b$ of the transistor $3a$ is given by $$Ib = \frac{10}{100^3} (A) = 10(\mu A) \qquad (1)$$

If the distortion voltage of 1 V is assumed to be generated between the base of the transistor $3a$ and the emitter of the transistor $3c$, the charging current Id forced to flow through the capacitance 11 is given by $$Id = \frac{1}{(2\pi \times 47 \times 10^{-12} \times 100 \times 10^3)^{-1}} (A) = 29.5(\mu A) \qquad (2)$$

From the above equations (1) and (2), it is noted that the charging current Id becomes larger than the base current Ib. Therefore, it is important for such an amplifier circuit to eliminate, at first, voltage distortion rather than to increase the number of the transistors to be connected in a Darlington fashion. Thus, it is desirable, in order to reduce both voltage and current distortion, to eliminate voltage distortion prior to eliminating current distortion.

One of the prior art techniques for reducing voltage and current distortion is the application of negative feedback. Negative feedback, however, has some deficiencies in its nature. There are limits to the degree of reduction of distortion such that the reduction degree charges in accordance with frequency, and in the limit at the gain crossing frequency or cut-off frequency there will be absolutely no improvement in distortion reduction. Moreover, since the feedback signal containing a distortion component passes throughout the feedback loop, irrespective of the location where distortion is originally generated, intermodulation distortion occurs between the signal to be amplified and the feedback signal. Again, in negative feedback, feedback signals have a comparable level to the signal to be amplified because the feedback signals contain not only a distortion component but also the signal to be amplified, so that the stability of the amplifier depends to a large extent on the transfer, i.e., frequency and phase, characteristics of the open gain of the amplifier. This results in a limited frequency band of negative feedback and a limited feedback amount, and hence there are limits to the distortion reduction effect.

SUMMARY OF THE INVENTION

It is, therefore, a principal object of the present invention to provide a novel amplifier with substantially no distortion.

It is another object of the present invention to provide the amplifier in which distortion generated in the amplifier is effectively cancelled out with a simple circuit construction.

It is still another object of the present invention to provide the amplifier in which the degree of distortion reduction does not depend on frequency so that no phase compensation or the like is required to attain high stability of the amplifier.

It is a further object of the present invention to provide the amplifier in which there exists no intermodulation between the signal to be amplified and the signal to be used for distortion cancellation due to a negligible amount thereof.

In a preferred example of the present invention which will be described hereinunder in detail, the amplifier comprises: a first input terminal to which a first input signal to be amplified is applied; a first output terminal from which an amplified first output signal is derived; an amplification means having a second input terminal and a second output terminal for amplifying a second input signal appearing at the second input terminal and producing at the second output terminal an amplified second output signal therefrom, the amplified second output signal being fed to the first output terminal; a distortion detection means for detecting, in accordance with the second input signal and the amplified second output signal, distortion generated in the amplification means and producing a third output signal therefrom; and an addition means connected between the first input terminal and the second input terminal for adding the third output signal to the first input signal in order to feed the resultant added signal which is the second input signal to the second input terminal of the amplification means.

The foregoing and other objects, the features and the advantages of the present invention will be pointed out in, or apparent from, the following description of the preferred embodiments considered together with the accompanying drawings.

DETAILED DESCRIPTION OF THE PREFERRED EMBODIMENTS

Figure 1:
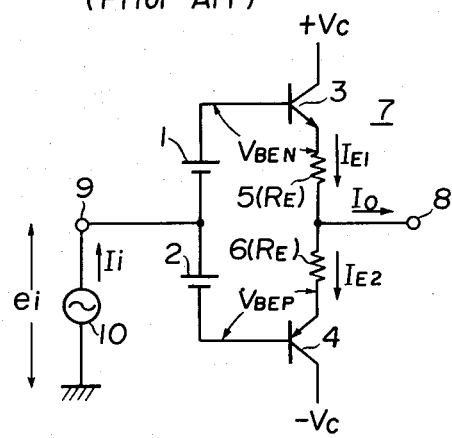
FIG. 1 is a schematic circuit diagram of a prior art typical class-B push-pull amplifier.
Figure 2:
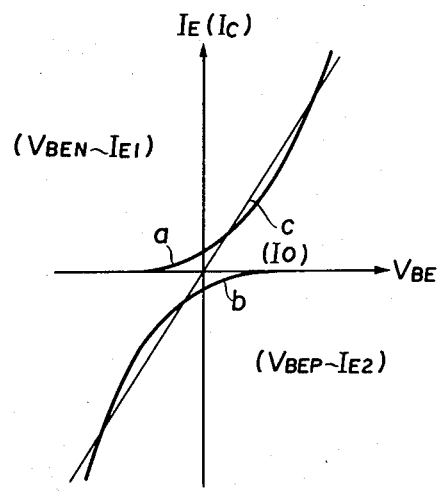
FIG. 2 is a graph showing a relation between the base-emitter voltage $V_{BE}$ and the collector current $I_c$ of transistors.
Figure 3:
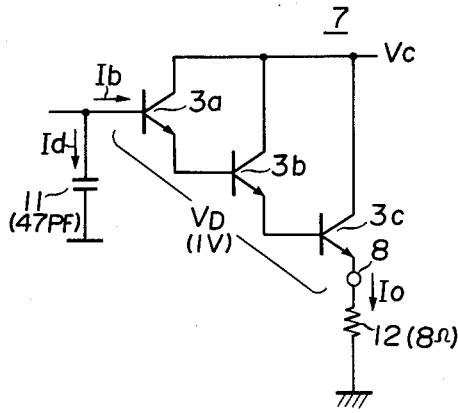
FIG. 3 is a schematic circuit diagram in which Darlington connected transistors are used for explaining a relation between voltage and current distortion.
Figure 4:
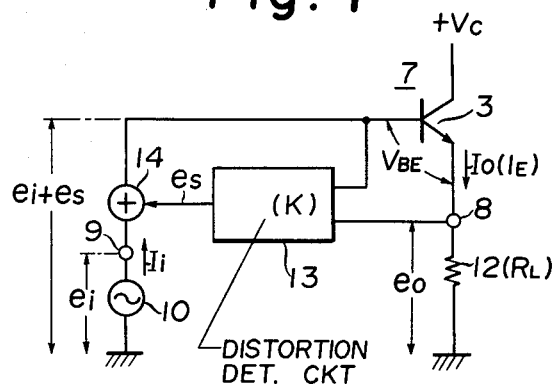
FIG. 4 is a schematic diagram for illustrating a basic principle of an amplifier according to the invention.

A circuit diagram for illustrating a basic principle of an amplifier according to the invention is shown in FIG. 4, wherein identical reference numerals have been used to designate corresponding parts of FIG. 1. For the simplification of description, a single type amplifier circuit is here employed. In FIG. 4, a distortion detection circuit 13 detects the base-emitter voltage $V_{BE}$ of the transistor 3 and then amplifies the voltage $V_{BE}$ by a gain factor K. The output voltage $e_s$ of the distortion detection circuit 13 is fed to a voltage addition circuit 14 which is connected between the input signal terminal 9 and the base electrode of the transistor 3. The driving voltage $e_i$ at the input signal terminal 9 and the output voltage $e_s$ are added together at the voltage addition circuit 14 to supply the resultant voltage ($e_i + e_s$) to the base of the transistor 3. In the amplifier thus constructed, the relation between the driving voltage $e_i$, the output voltage $e_s$, the base-emitter voltage $V_{BE}$ and the voltage $e_o$ appearing at the output terminal 8 is given by $$e_i + e_s = V_{BE} + e_o \tag{3}$$

The base-emitter voltage $V_{BE}$ is expressed as $$V_{BE} = \frac{1}{g_m} \cdot I_o = \frac{1}{g_m} \cdot \frac{e_o}{R_L} \tag{4}$$

where $g_m$ is a mutual conductance of the transistor 3. The output voltage $e_s$ is expressed as $$e_s = K \cdot V_{BE} = \frac{K}{g_m} \cdot \frac{e_o}{R_L} \tag{5}$$

By substituting the equations (4) and (5), the above equation (3) is rearranged as $$e_i = e_o \left( 1 + \frac{1}{g_m \cdot R_L} - \frac{K}{g_m \cdot R_L} \right) \tag{6}$$

From the equation (6), the transfer gain $A_v$ of the amplifier shown in FIG. 4 may be given by $$A_v = \frac{e_o}{e_i} = \frac{1}{1 + \frac{1-K}{g_m \cdot R_L}} \tag{7}$$

The equation (7) indicates that if the gain factor K is "1", the transfer gain $A_v$ of the amplifier equals to 1 irrespective of the mutual conductance $g_m$ and the base-emitter voltage $V_{BE}$. Thus, the distortion of the amplifier is completely cancelled out. Since the current flow- With such a circuit configuration, assuming that each value of the resistors 15a, 15b, 16 and 18 meets the condition Ra, Rb>>R_E and that the voltages of the bias sources 1 and 2 are equal, the voltage $V_y$ appearing at between the two connection points of the bias sources 1, 2 and the emitter resistors 5, 6 is $$V_y = V_{BEN} + R_E \cdot I_{E1} - V_{BEP} - R_E \cdot I_{E2} \qquad (14)$$

Since the resistors 15a and 15b, connected to the respective bases of the transistors 3 and 4, is considered to be connected in equivalently parallel to the connection point of the bias sources 1 and 2, the voltage $V_x$ is given by the following equation $$V_x = \frac{Rb}{\frac{Ra}{2} + Rb} \cdot (V_y + R_E \cdot I_o) - R_E \cdot I_o$$

$$= \frac{2Rb \cdot (V_{BEN} - V_{BEP} + R_E \cdot I_{E1} - R_E \cdot I_{E2} + R_E \cdot I_o)}{Ra + 2Rb}$$

$$- R_E \cdot I_o$$

Figure 8:
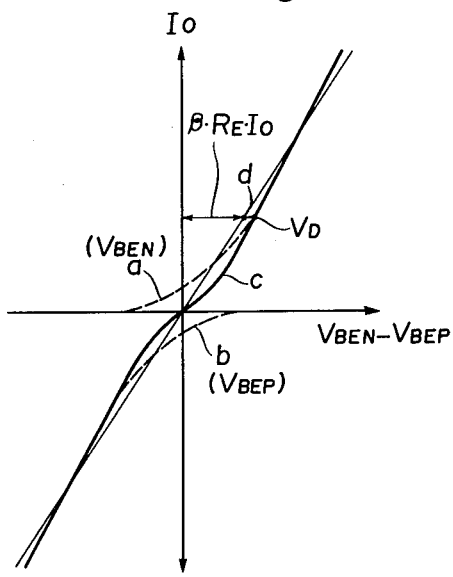
FIG. 8 is a graph showing a relation between the base-emitter voltage $V_{BE}$ and the output current $I_o$, and between linear and distortion components contained in the base-emitter voltage $V_{BE}$.

The current $I_0$ is expressed as $I_0 = I_{E1} - I_{E2}$ so that the voltage $V_x$ may become $$V_x = \frac{2Rb}{Ra + 2Rb} \cdot (V_{BEN} - V_{BEP}) + \frac{2Rb - Ra}{Ra + 2Rb} \cdot R_E \cdot I_o \qquad (15)$$

wherein the voltage ($V_{BEN} - V_{BEP}$) represents the difference between the base-emitter voltage of the transistors 3 and 4 when the current $I_0$ is flowing. The relation between the voltage ($V_{BEN} - V_{BEP}$) and the current $I_0$ is shown in FIG. 8, wherein a chain line a represents a relation between the base-emitter voltage $V_{BEN}$ and the current $I_0$, a solid line b represents a relation between the base-emitter voltage $V_{BEP}$ and the current $I_0$, and solid line c represents a relation between the base-emitter voltage difference ($V_{BEN} - V_{BEP}$) and the current $I_0$. As is readily understood from FIG. 8, the voltage ($V_{BEN} - V_{BEP}$) is divided into two parts, that is, the distortion voltage component $V_D$ and the distortion free or linear voltage component $\beta \cdot R_E \cdot I_0$ which changes linearly with the current $I_0$ shown as a straight line d. Therefore, the voltage ($V_{BEN} - V_{BEP}$) is given by $$V_{BEN} - V_{BEP} = \beta \cdot R_E \cdot I_o + V_D \qquad (16)$$

From the equation (16), the equation (15) is rearranged as $$V_x = \frac{2Rb}{Ra + 2Rb} \cdot (\beta \cdot R_E \cdot I_o + V_D) - \frac{Ra - 2Rb}{Ra + 2Rb} \cdot R_E \cdot I_o \qquad (17)$$

$$= \frac{2Rb}{Ra + 2Rb} \cdot V_D + \frac{2\beta \cdot Rb - Ra + 2Rb}{Ra + 2Rb} \cdot R_E \cdot I_o$$

If the resistance values Ra and Rb are set to be $(2\beta \cdot Rb - Ra + 2Rb) = 0$, then the voltage $V_x$ is given by $$V_x = \frac{2Rb}{Ra + 2Rb} \cdot V_D \qquad (18)$$

The above equation indicates that the voltage $V_x$ is exactly proportionate to the distortion voltage $V_D$, thus only the distortion component can be detected.

Figure 7:
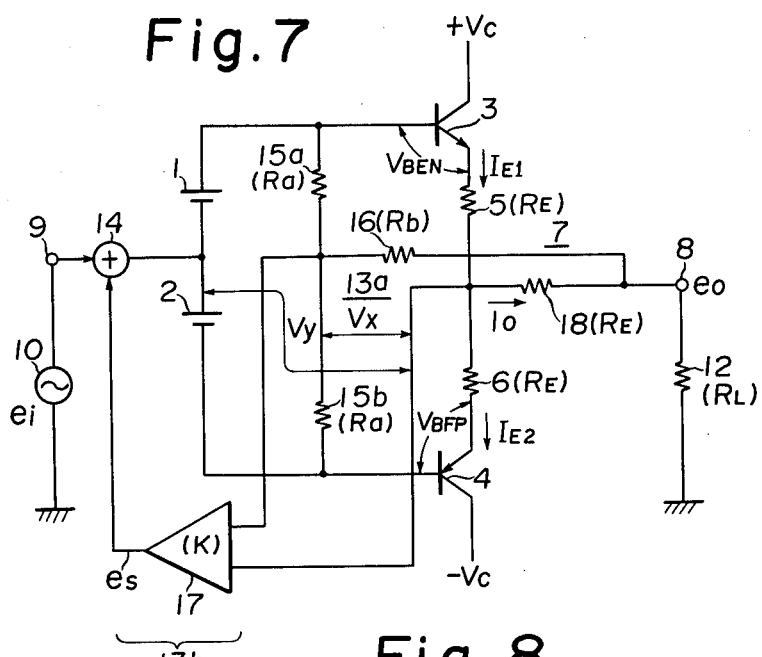
FIG. 7 shows a circuit arrangement of a first embodiment of the invention.

In the circuit configuration of the first embodiment shown in FIG. 7, the following equations may be established.

$$e_i + e_s = V_y + R_E \cdot I_o + e_o \qquad (19)$$

$$e_i + K \cdot V_x = V_y + R_E \cdot I_o + e_o$$

The equations (14) and (16) are substituted into the above equation (19), then $$e_i + K \cdot V_x = (V_{BEN} - V_{BEP}) + 2R_E \cdot I_o + e_o \qquad (20)$$

$$= V_D + (2 + \beta) \cdot R_E \cdot I_o + e_o$$

The equation (18) is substituted into the above equation (20), then the following equation is obtained.

$$e_i + K \frac{2Rb}{Ra + 2Rb} \cdot V_D = V_D + (\beta + 2) \cdot R_E \cdot I_o + e_o \qquad (21)$$

If the gain factor K is set to be $$K = \frac{Ra + 2Rb}{2Rb},$$

then the equation (21) is expressed as $$e_i = (\beta + 2) \cdot R_E \cdot I_o + e_o \qquad (22)$$

From the above equation (22), it is understood that in the first embodiment as above the relation between the driving voltage $e_i$ and the output voltage $e_o$ has no relation to distortion.

Apart from the above circuit analysis, the concept of mutual conductance is introduced. Then, the following definition is available in connection with the linear component $\beta \cdot R_E \cdot I_0$ of the voltage ($V_{BEN} - V_{BEP}$) shown as the straight line d in FIG. 8, when taking $\bar{g}_m$ as an average mutual conductance of the transistors 3 and 4.

$$\beta \cdot R_E \cdot I_o = \frac{1}{\bar{g}_m} I_o \qquad (23)$$

This equation is simplified as $$\beta \cdot R_E = \frac{1}{\bar{g}_m} \qquad (24)$$

Therefore, the equation (22) may be expressed as $$e_i = \left(\frac{1}{\bar{g}_m} + 2R_E\right) \cdot I_o + e_o \qquad (25)$$

$$= \left(\frac{1}{\bar{g}_m} + 2R_E\right) \cdot \frac{e_o}{R_L} + e_o$$

The voltage gain $e_o/e_i$ is expressed in the term of $\bar{g}_m$ as $$e_o/e_i = \frac{1}{1 + \frac{1}{\bar{g}_m \cdot R_L} + \frac{2R_E}{R_L}} \qquad (26)$$

ing into and out of the distortion detection circuit 13 is set at a negligble amount, the relation $I_E = h_{FE} \cdot I_i$ is still applicable to the amplifier. It is also appreciated that the amplifier with a transfer gain $$A_v = \frac{1}{1 - \frac{1}{g_m \cdot R_L}}$$

at K=0, has the same amount of distortion as the conventional one without the distortion detection circuit 13, and that the amplifier with a transfer gain $$A_v = \frac{1}{1 - \frac{1}{g_m \cdot R_L}}$$

at K=2, has the distortion equal in amount and inverse in phase as the conventional one.

In the above basic principle of an amplifier according to the invention, the base-emitter voltage $V_{BE}$ itself is directly added to the driving voltage $e_i$ after multiplied by the gain factor K. In practice, it is noted, however, using only the distortion component contained in the base-emitter voltage $V_{BE}$ which also contains a linear component is sufficient for cancelling out the distortion generated across the base-emitter voltage $V_{BE}$. This is also effective for the improvement of stability of the amplifier.

Figure 5:
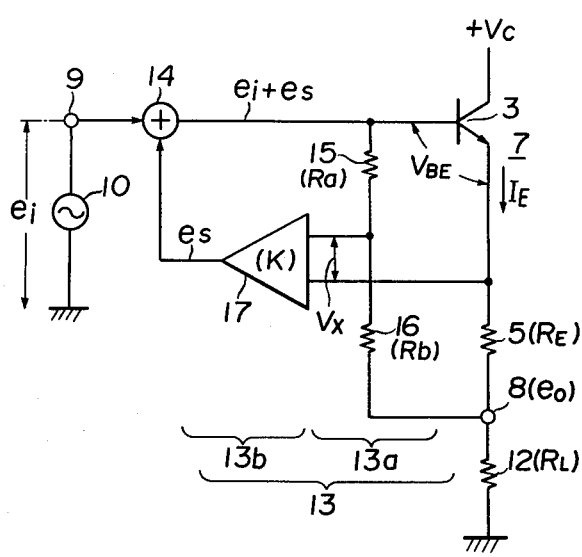
FIG. 5 shows a basic circuit configuration of an amplifier according to the invention.

Referring now to FIG. 5, a basic circuit configuration of the distortion detection circuit will be described in more detail in order to understand how the distortion component is discriminated and detected from the output of the amplifier. The distortion detection circuit 13 is comprised of a distortion detection section 13a, and a distortion amplification section 13b which is illustratively shown as a differential amplifier 17. The distortion detection section 13a comprises a resistor 15 (value Ra) and a resistor 16 (value Rb) in combination with an emitter resistor 5 (value $R_E$). The resistors 15 and 16 are connected in series between the base of the transistor 3 and the output terminal 8, and the resistor 5 is connected between the emitter of the transistor 3 and the output terminal 8 which is grounded via a load 12 (value $R_L$). A voltage $V_x$, obtained from between the connection point of the resistors 15 and 16 and the emitter electrode of the transistor 3, is applied to the differential amplifier 17 where the voltage $V_x$ is amplified by a gain factor K. The output (voltage $e_s$) of the differential amplifier 17 is then fed to the voltage addition circuit 14 to effect the addition of the output voltage $e_s$ to the input voltage $e_i$. Assuming each value of the resistors 5, 12, 15 and 16 suffices the condition Ra, Rb >> $R_E$, $R_L$, the voltage $V_x$ may be expressed as $$V_x = \frac{(V_{BE} + R_E \cdot I_E) \cdot Rb}{Ra + Rb} - R_E \cdot I_E \quad (8)$$

$$= \frac{V_{BE} \cdot Rb}{Ra + Rb} - \frac{Ra}{Ra + Rb} \cdot R_E \cdot I_E$$

Figure 6:
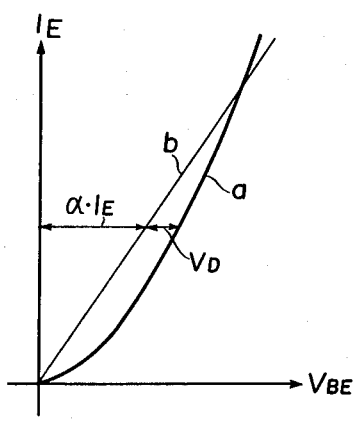
FIG. 6 is a graph showing a relation between linear and distortion components contained in the base-emitter voltage $V_{BE}$.

Referring to FIG. 6, the relation between the base-emitter voltage $V_{BE}$ and the emitter current $I_E$ is shown diagrammatically, wherein a curve a represents a real characteristic curve of the transistor 3, and a straight line b represents an ideal characteristic line of the transistor 3. The base-emitter voltage $V_{BE}$ may be divided into two parts, that is, one being a linear component $I_E$ and the other being a distortion component $V_D$. Thus, the base-emitter voltage $V_{BE}$ may be expressed as $$V_{BE} = \alpha \cdot I_E + V_D \quad (9)$$

$$= \beta \cdot R_E \cdot I_E + V_D$$

Substituting this equation (9) into the equation (8), the following equation is derived $$V_x = \frac{Rb}{Ra + Rb} \cdot (\beta \cdot R_E \cdot I_E + V_D) - \frac{Ra}{Ra + Rb} \cdot R_E \cdot I_E \quad (10)$$

$$= \frac{Rb}{Ra + Rb} \cdot V_D + \frac{\beta \cdot Rb - Ra}{Ra + Rb} \cdot R_E \cdot I_E$$

In the equation (10), the resistance values Ra and Rb are chosen to meet the condition $Ra = \beta \cdot Rb$, then the voltage $V_x$ is given by $$V_x = Rb/(Ra+Rb) \cdot V_D \quad (11)$$

The voltage $V_x$ is recognized from the above equation (11) to be proportionate only to the distortion voltage $V_D$. The relation between the driving voltage $e_i$ and the output voltage $e_0$ is expressed in the following equations, by using the above equation (11).

$$e_i + e_s = V_{BE} + R_E \cdot I_E + e_o \quad (12)$$

$$e_i + K \cdot V_x = V_D + (1 + \beta) \cdot R_E \cdot I_E + e_o$$

$$e_i + \frac{K \cdot Rb}{Ra + Rb} \cdot V_D = V_D + (1 + \beta) \cdot R_E \cdot I_E + e_o$$

In the equation (12), the gain factor K is chosen to meet the condition $K = (Ra+Rb)/Rb$, then the equation (12) is expressed as $$e_i = (1+\beta) \cdot R_E \cdot I_E + e_o \quad (13)$$

From the equation (13), it is found that the relation between the driving voltage $e_i$ and the output voltage $e_0$ is independent from the distortion voltage $V_D$. In other words, the distortion generated in the transistor 3 is fully cancelled out.

Next, a first embodiment of the invention will be described in which the above basic circuit is applied to a class-B push-pull circuit, and in which identical reference numerals have been used to designate corresponding parts of FIGS. 1 through 5. In FIG. 7, transistors 3 and 4 with emitter resistors 5 and 6 (both at the same value of $R_E$) connected to respective emitters are supplied with bias current from respective bias sources 1 and 2 to constitute a class-B push-pull amplifier circuit 7. Resistors 15a and 15b (both at the same value of Ra) are connected in series between the respective bases of the transistors 3 and 4 with the connection point therebetween connected to the output terminal 8 through a resistor 16 (value Rb). The connection point of the emitter resistors 5 and 6 is also connected to the output terminal 8 through a resistor 18 (value $R_E$). The above resistors 5, 6, 15a, 15b, 16 and 18 constitute a distortion detection section 13a, wherein the voltage $V_x$ developed across the two connection points between the resistors 15a, 15b and the emitter resistors 5, 6 is applied to the input of the next stage, that is, a differential amplifier 17 which constitutes a distortion amplification section 13b.

Next, the stability of the amplifier shown in the embodiment of FIG. 7 is analysed. The modification of the equation (21) is made to obtain the following equation $$e_i = V_D \left( 1 - K \cdot \frac{2Rb}{Ra + 2Rb} \right) + e_o + \frac{e_o}{g_m \cdot R_L} + \frac{2R_E \cdot e_o}{R_L} \quad (27)$$

Here, the assumption is made that a new defined mutual conductance $g_m'$ relates only to the distortion voltage $V_D$ contained in the mutual conductance $g_m$ of the transistors 3 and 4, then the distortion voltage $V_D$ may be expressed as $$V_D = \frac{1}{g_m'} I_o = \frac{e_o}{g_m' \cdot R_L} \quad (28)$$

When this equation is substituted into the equation (27), the relation between the driving voltage $e_i$ and the output voltage $e_o$ is expressed as $$e_i = \frac{e_o}{g_m' \cdot R_L} \cdot (1 - K \cdot J) + e_o + \frac{e_o}{g_m \cdot R_L} + \frac{2R_E \cdot e_o}{R_L} \quad (29)$$

$$= e_o \left\{ 1 + \frac{1}{g_m \cdot R_L} + \frac{1 - K \cdot J}{g_m' \cdot R_L} + \frac{2R_E}{R_L} \right\}$$

where $$J = \frac{2Rb}{Ra + 2Rb}$$

From the equation (29), the voltage gain $e_o/e_i$ of the amplifier is given by $$e_o/e_i = \frac{1}{\left\{ 1 + \frac{1}{g_m \cdot R_L} + \frac{(1 - K \cdot J)}{g'_m \cdot R_L} + \frac{2R_E}{R_L} \right\}} \quad (30)$$

This equation indicates that the distortion is not cancelled out when $Kj=0$, however, the distortion is fully cancelled out when $Kj=1$, and when $Kj=2$ the distortion is reversed in phase as compared with that of when $Kj=0$. For the purpose of understanding the equation (30) more concretely, the numerical values, which are being obtained in a practical use, are substituted therein. In the conventional power transistor, when the base-emitter voltage $V_{BE}$ is set at 1.5 V, its collector current of about 5 A can be obtained, then the reciprocal of the average mutual conductance of the transistors 3 and 4 is estimated as $(1.5/5)=0.3\Omega$. As a result, the reciprocal $1/\overline{g_m}$ of the total conductance, taking into account, the resistance values of 0.3Ω of the emitter resistors 5 and 6, is about 0.6Ω. Since a distortion factor of typical class-B push-pull amplifier when no feedback is employed is commonly has a value of 0.1 to 0.2%, the reciprocal $1/gm'$ of the mutual conductance which relates only to the distortion voltage $V_D$ is about 1 mΩ. Therefore, the relation between the $1/\overline{g_m}$ and the $1/gm'$ is given by $$\frac{1}{g_m'} = \frac{1}{600} \cdot \frac{1}{\overline{g_m}} \quad (31)$$

The equation (31) is substituted into the equation (30), then $$\frac{e_o}{e_i} = \frac{1}{\left\{ 1 + \frac{1}{\overline{g_m} \cdot R_L} \cdot \left( 1 + \frac{1}{600} - \frac{K \cdot J}{600} \right) + \frac{2R_E}{R_L} \right\}} \quad (32)$$

From the above equation (32), it is noted that the variation of the value within the small parenthesis in the divisor is maintained within the variation range of 1/600, even if the gain factor K is changed to 0, 1 or 2. From this understanding, and from the fact that the amplifier of the first embodiment is so constructed as to cancel out distortion by using only the distortion voltage component $V_D$, it is concluded that, when compared with the signal level to be amplified as a whole, the change in phase, if any, of the distortion component which passes through the distortion detection circuit is negligibly small, thereby imparting no adverse effect upon the circuit and enabling a high stability of amplification of the circuit.

Figure 9:
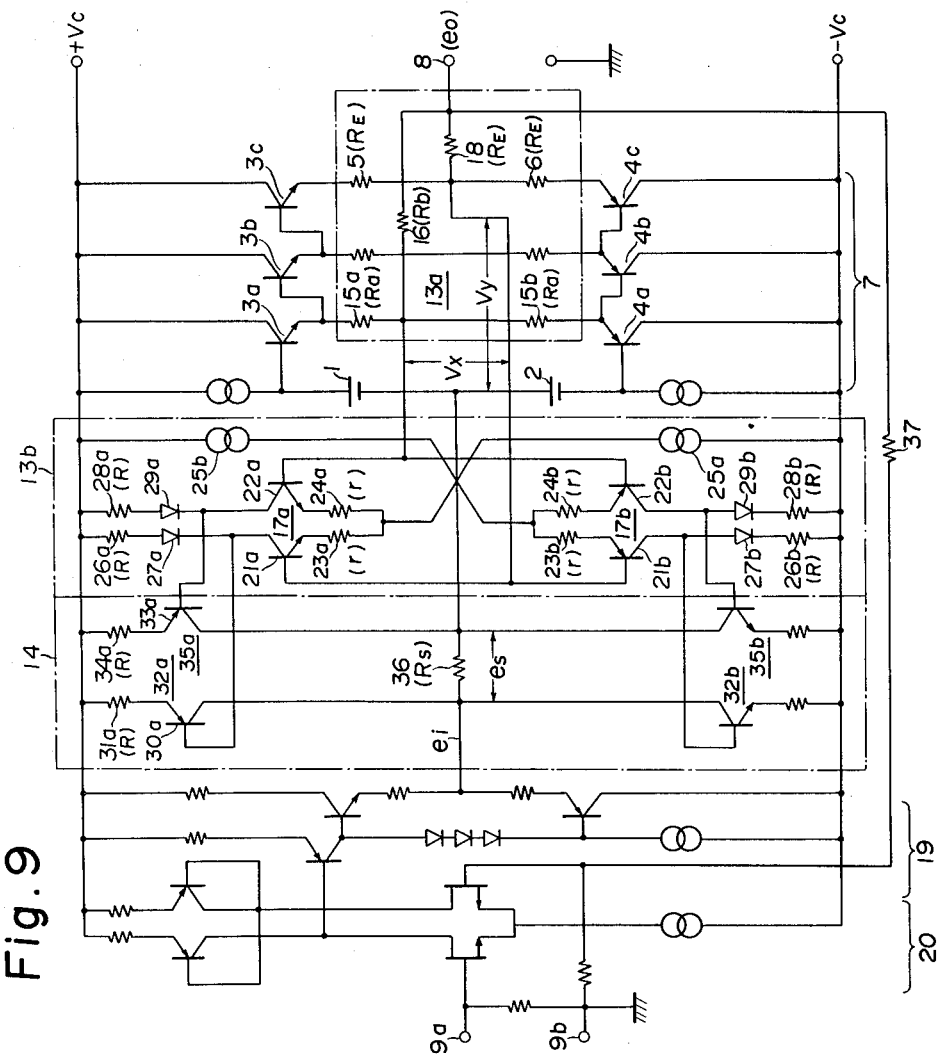
FIG. 9 shows a concrete circuit arrangement of the first embodiment of the invention.

Turning now to FIG. 9, there is shown a more concrete circuit of the amplifier in accordance with the first embodiment. In FIG. 9, an amplifier circuit 7 is comprised of transistors 3a through 3c and transistors 4a through 4c, each group of the transistors being connected in a Darlington configuration to constitute a class-B push-pull amplifier circuit. The amplifier circuit 7 is driven by a driver stage amplifier circuit 19 which is connected to a pre-amplifier circuit 20. The preamplifier circuit 20 is supplied with an input signal via input terminals 9a and 9b. A distortion detection section 13a is coupled to the amplifier circuit 7, wherein resistors 15 and 15b are connected between the bases of the transistors 3b and 4b. The distortion amplification section 13b is comprised of a first differential amplifier 17a and a second differential amplifier 17b. In the first differential amplifier 17a including two transistors 21a and 22a (NPN transistor), the emitters are connected to the respective emitter resistors 23a and 24a (value r), which are coupled together and supplied with a negative power source $-V_c$ through a constant current source 25a, and the collectors are coupled to a positive power source $+V_c$ through respective serially connected diode 27a or diode 29a and resistor 26a or 28a (value R). The circuit configuration of the differential amplifier 17b is symmetrical to that of the differential amplifier 17a, and the corresponding elements are represented by using a suffix b. In the circuit configuration as above, the output voltage $V_x$ of the distortion detection section 13a is applied to the common base of the transistors 21a and 21b and to the common base of the transistors 22a and 22b. A voltage addition circuit 14 is comprised of two pairs of current mirror circuits 32a, 35a, and 32b, 35b. For the purpose of brevity of description, only the first pair of the current mirror circuits 32a and 35a is described, the second pair being constructed similarly to the first one. The emitter of a transistor 30a (PNP) of the current mirror circuit 32a is connected through an emitter resistor 31a (value R) to the positive power source $+V_c$, while the emitter of a transistor 33a (PNP)

is connected through an emitter resistor 34a (value R) to the positive power source +V$_c$. The bases of the transistors 30a and 33a are connected to the collectors of the transistors 21a and 22a, respectively. Thus, the collector current of the transistor 30a is equal to that of the transistor 21a, and the collector current of the transistor 33a to that of the transistor 22a. The difference of the currents flowing through the current mirror circuits 32a, 35b and 35a, 32b is detected by a resistor 36 (value R$_s$) to convert the difference current to the corresponding voltage. The voltage e$_s$ appearing across the resistor 36 is added to the driving voltage e$_i$ outputted from the driver stage amplifier 19, and has a value of $$e_s = 2 \cdot \left(\frac{R_s}{2r}\right) \cdot V_x = \frac{R_s}{r} \cdot V_x \tag{33}$$

Incorporating the voltage V$_x$, which is represented as 2Rb/(Ra+2Rb)·V$_D$ shown in the equation (18), into the above equation, the result is $$e_s = \frac{R_s}{r} \times \frac{2Rb}{Ra + 2Rb} \cdot V_D \tag{34}$$

If the resistance values of R$_s$ and r are set to be R$_s$/r=(Ra+2Rb)/2Rb, the voltage e$_s$ is $$e_s = V_D \tag{35}$$

Figure 10:
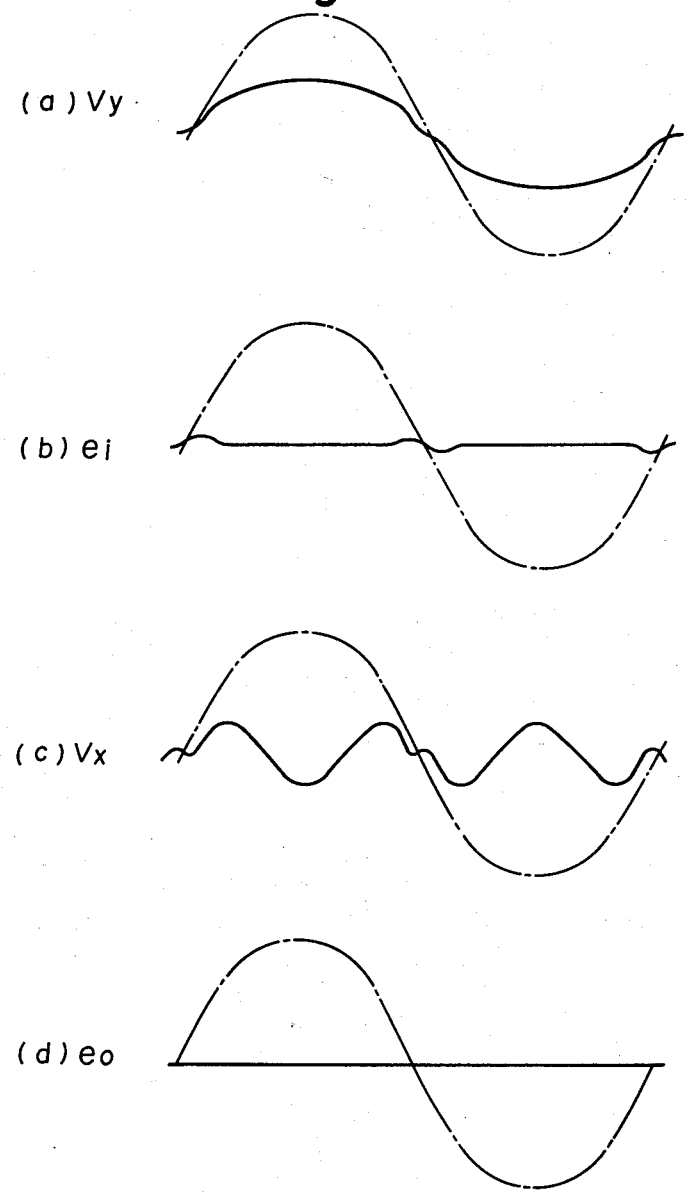
FIG. 10 shows various waveforms obtained in the circuit of FIG. 9.

This equation clearly shows that, in the concrete circuit of the first embodiment shown in FIG. 9, only the distortion component generated in the amplifier circuit 7 is detected. The provision of a resistor 37, which feeds back the output at the output terminal 8 to the pre-amplifier circuit 20, enhances the above distortion cancellation operation. In order to show the effects of the invention, the experimental results obtained in the embodiment in FIG. 9 are illustrated in FIG. 10. The reference symbols V$_s$, V$_y$, e$_i$ and e$_o$ respectively correspond to those used in FIG. 9. In FIG. 10, a solid line represents a distortion waveform, and a one-dot-chain line represents an output waveform which also serves as a reference to the phase relation between the distortion waveforms shown in FIGS. 10(a) to 10(d).

Figure 11:
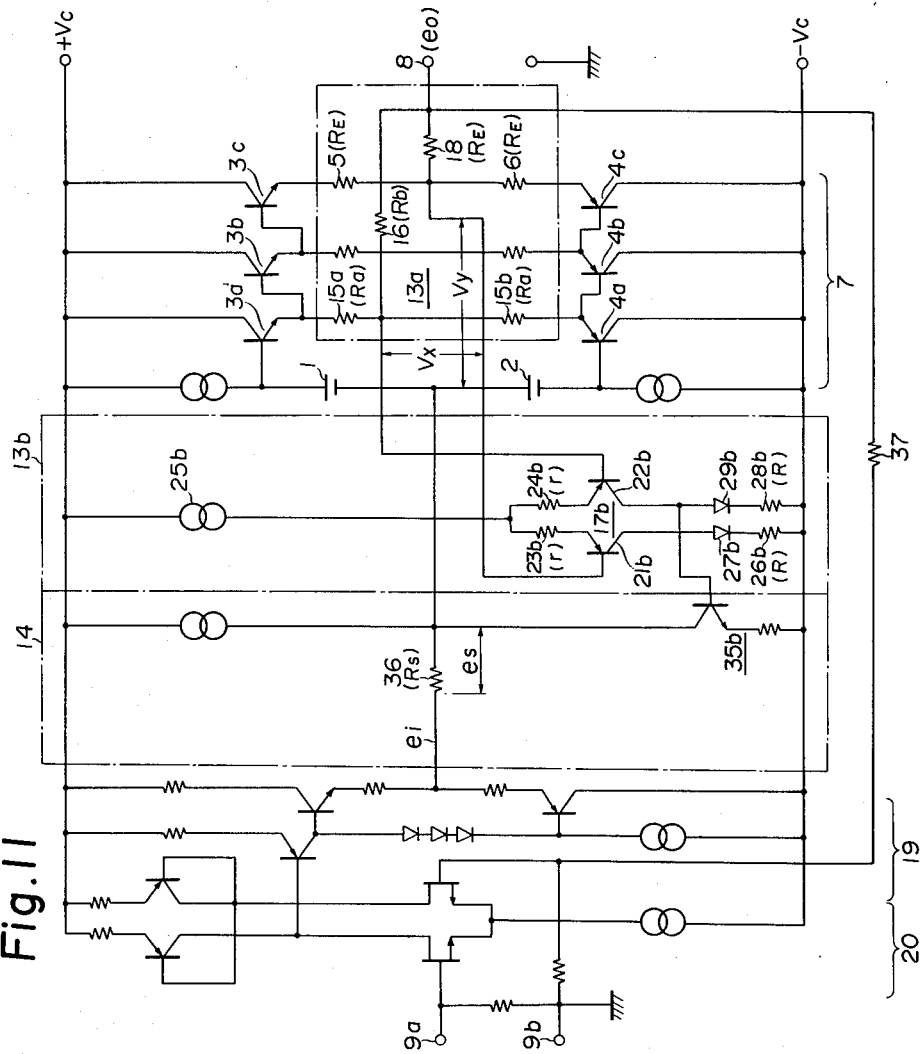
FIG. 11 shows a modified circuit arrangement of the first embodiment of FIG. 9.

A modified circuit of the first embodiment shown in FIG. 9 is illustrated in FIG. 11. This modified circuit configuration is simplified by removing from the first embodiment the first differential amplifier 17a and the current mirror circuits 32a, 35a and 32b, and by adding one constant current source 141 connected between the positive power source +V$_c$ and the collector of the transistor of the current mirror circuit 35b. With such arrangement, the output voltage V$_x$ of the distortion detection section 13d is applied to the bases of the transistors 21b and 22b, and converted to a corresponding current in the current mirror circuit 35b which flows into or cut of the resistor 36. Similarly to the first embodiment, the voltage e$_s$ is added to the driving voltage e$_i$ delivered from the driver stage amplifier 19 so that distortion cancellation is also attained, though a slight effect upon the driver stage amplifier 19 is caused due to the current variation in the current mirror circuit 35b.

Figure 12:
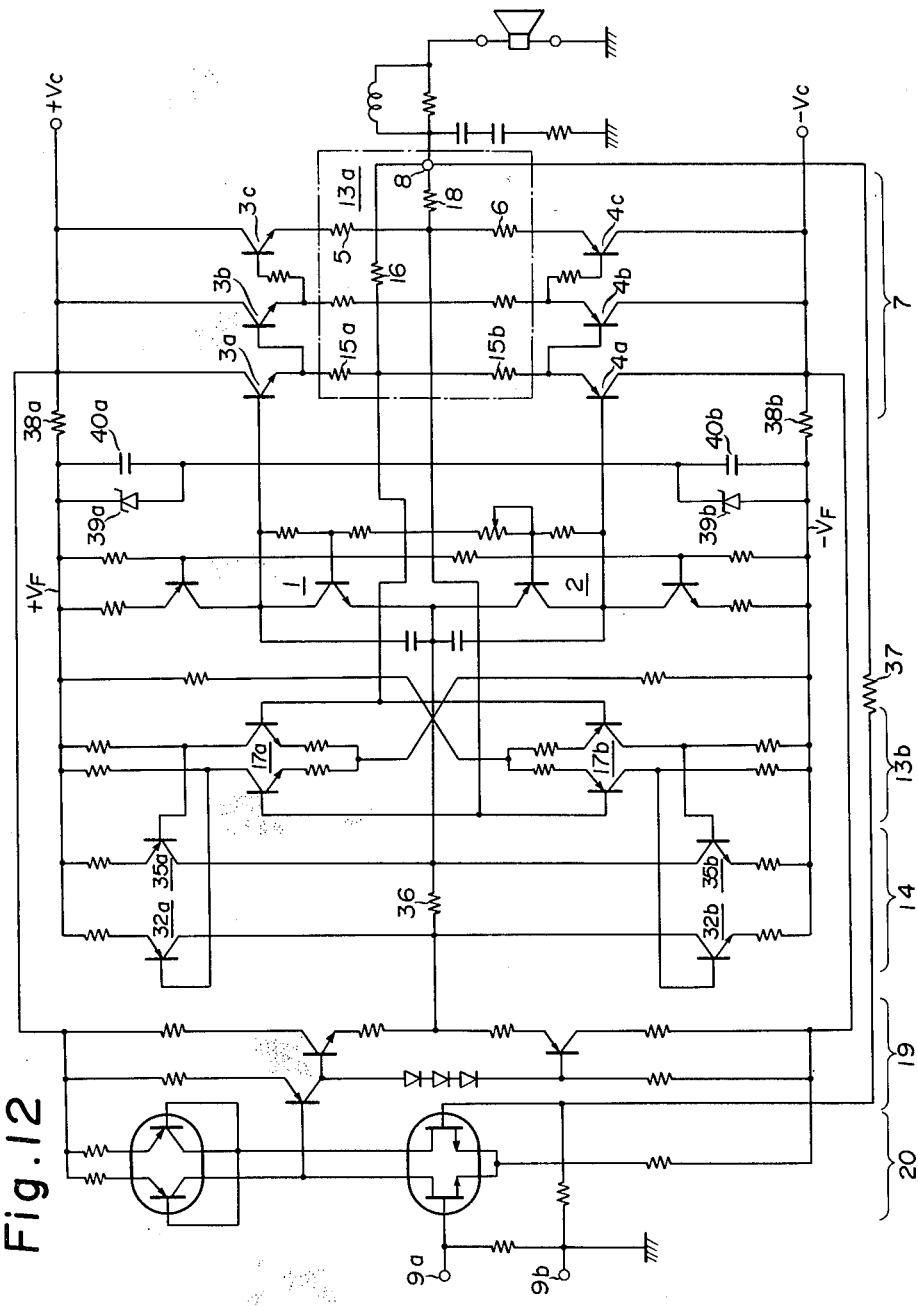
FIG. 12 shows a circuit arrangement of a second embodiment of the invention.

Next, a second embodiment of the amplifier according to the invention is described with reference to FIG. 12. The second embodiment shown in FIG. 12 differs from the first embodiment shown in FIG. 9 in that the former aims at operating the distortion amplification section 13b and the voltage addition circuit 14 with a floating power source. The voltage supplied from the power source +V$_c$ is divided by a network comprising a resistor 38a, a Zener diode 39a and a capacitor 40a connected across the diode 39a. The resistor 38a is connected between the power source +V$_c$ and the one end of the Zener diode 39a, the other end of which is connected to the connection point of the emitter resistors 5 and 6. Therefore, a floating voltage +V$_F$ is supplied from the connection point of the resistor 38a and the Zener diode 39a to the distortion amplification section 13b and to the voltage addition circuit 14. Alternatively, a floating voltage −V$_F$ is supplied from the connection point between the resistor 38b and the Zener diode 39b across which a capacitor 40b is coupled. Owing to the application of the floating power source to the distortion amplification section 13b and the voltage addition circuit 14, the transistors employed in the associated circuits may have a low collector-emitter voltage, thus enabling the generation of distortion originated from the collector junction resistance to decrease, and ensuring a complete distortion elimination.

Figure 13:
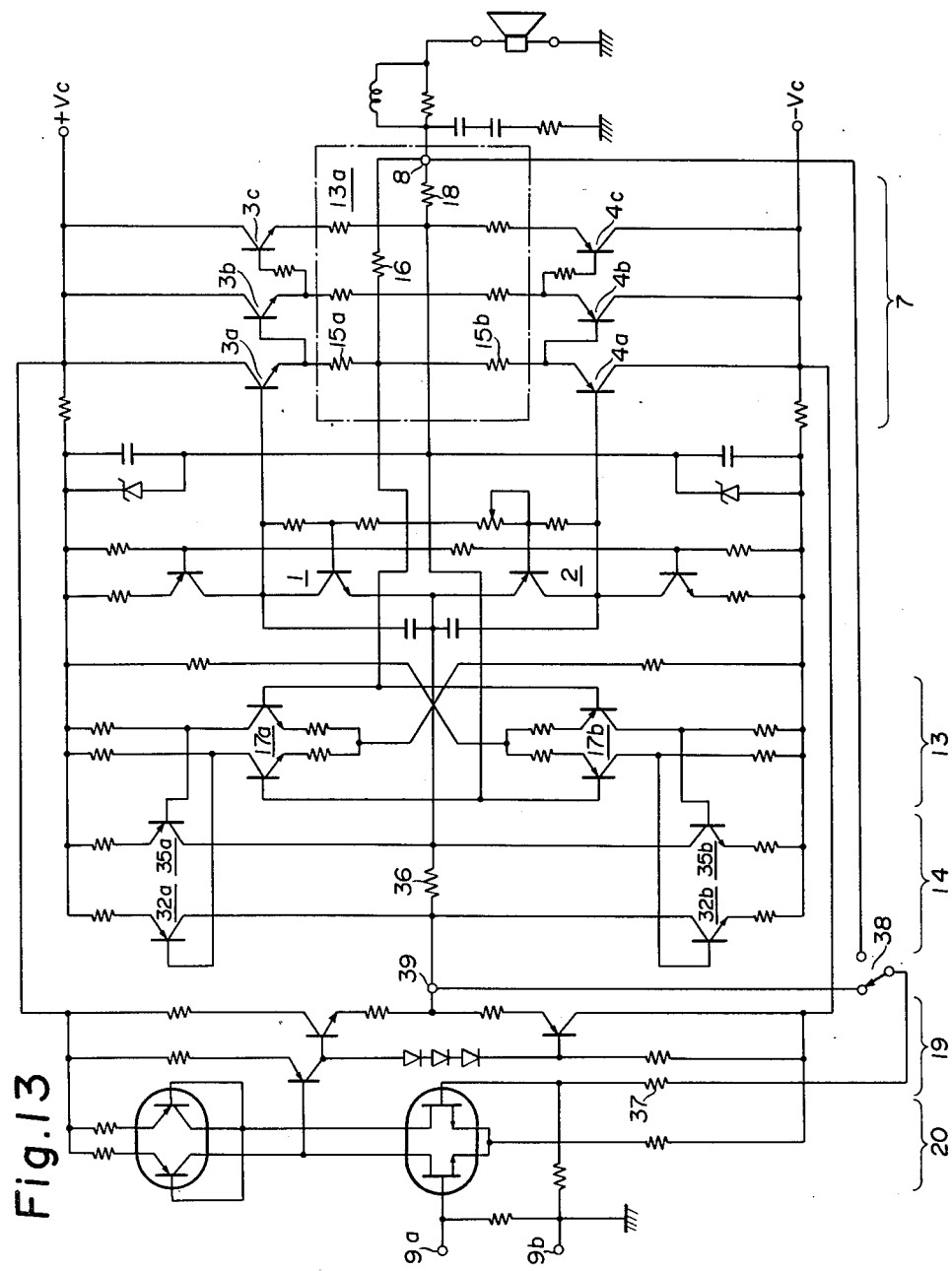
FIG. 13 shows a circuit arrangement of a third embodiment of the invention.

FIG. 13 shows a circuit diagram of a third embodiment of the amplifier according to the invention. The difference between this embodiment and the second embodiment shown in FIG. 11 is the provision of a turnover switch 38 for changing feedback loops. In FIG. 13, the turnover switch 38 is comprised of a common terminal and two selection terminals, the common terminal being connected through a resistor 37 to the pre-amplifier 20, while the two selection terminals being connected to respectively an output terminal 39 of the driver stage amplifier circuit 19 and the output terminal 8 of the amplifier. Thus, upon manipulation of the turnover switch 38, either one of the outputs from the driver stage amplifier circuit 19 or the amplifier is selectively fed back to the pre-amplifier 20. Since the distortion generated in the amplifier circuit 7 is fully cancelled out, it may be possible to apply feedback techniques only to the driver stage amplifier circuit 19 without employing an overall feedback loop from the amplifier circuit 7. As a result, the driver stage amplifier circuit 19 may be constructed as having a high speed characteristic thereby enabling to obtain high quality amplifiers.

Figure 14:
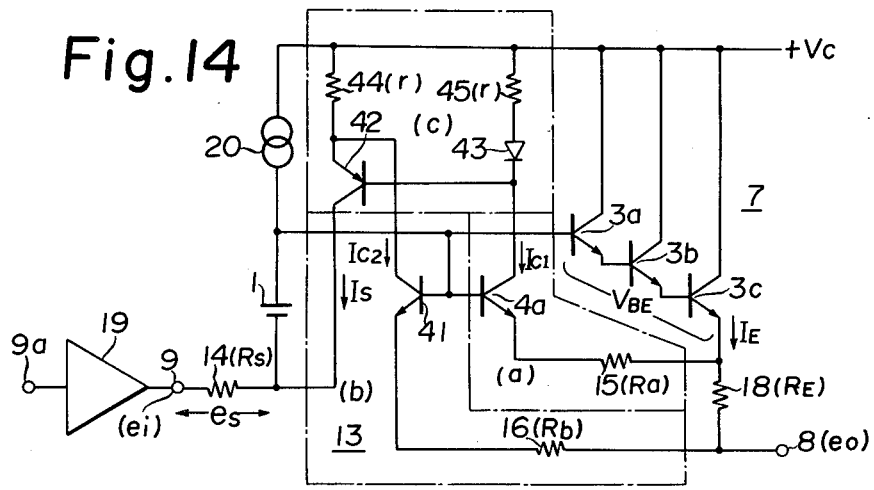
FIG. 14 shows a circuit arrangement of a fourth embodiment of the invention.

FIG. 14 shows a circuit diagram of a fourth embodiment of the amplifier according to the invention. The difference between this embodiment and the first through third embodiments is the construction of the distortion detection circuit and addition circuit.

In FIG. 14, an amplifier circuit 7 is comprised of three Darlington connected transistors 3a through 3c which are supplied with a bias source 1. A first distortion detection circuit (a) is comprised of a transistor 40 (NPN type) and a resistor 15 (value Ra). The base of the transistor 40a is connected to the base (input of the amplifier circuit 7) of the transistor 3a, while the emitter of the transistor 40a is connected through the resistor 15 to the emitter (output of the amplifier circuit 7) of the transistor 3c. A second distortion detection circuit (b) is comprised of a transistor 41 (NPN type) and a resistor 16 (value Rb). The base of the transistor 41 is connected to the base of the transistor 3a, while the emitter of the transistor 41 is connected through the resistor 16 to an output terminal 8 to which a load is connected and the emitter of the transistor 3c is connected via a resistor 18 (value R$_E$). An operational circuit (c) is comprised of a transistor 42 (PNP type), diode 43 and resistors 44 and 45. The base of the transistor 42 is connected to the cathode of the diode 43 the anode of which is connected through the resistor 45 to a positive power source $+V_c$, while the emitter of the transistor 42 is connected through the resistor 44 to the positive power source $+V_c$. With this circuit connection, the resistors 44 and 45 have the same resistance value r, and the transistor 42, the resistor 44, the diode 43, and the resistor 45 constitute a current mirror circuit. Further, the base of the transistor 42 is connected to the collector of the transistor 40, the emitter of the transistor 42 being connected to the collector of the transistor 41. An addition circuit is comprised of a resistor 14 (value $R_s$) one terminal of which is connected to a signal input terminal 9, and the other terminal is connected to the collector of the transistor 42, and via the bias source 1 to the base of the transistor 3a. A constant current source is designated by a reference numeral 20, and a driver stage amplifier circuit for driving the amplifier circuit 7 is designated by a reference numeral 19.

In the amplifier thus constructed, assuming that the resistance value of the respective resistors 15, 16 and 18 suffices the relation Ra, Rb$>>$$R_E$, and that the base-emitter voltage of the respective transistors 40 and 41 is negligibly small, the collector current $I_{c1}$ of the transistor 40 is expressed as $$I_{c1} = V_{BE}/Ra \tag{36}$$

where $V_{BE}$ represents a voltage between the base of the transistor 3a and the emitter of the transistor 3c. And, the collector current $I_{c2}$ of the transistor 41 is expressed as $$I_{c2} = \frac{V_{BE} + R_E \cdot I_E}{Rb} \tag{37}$$

Since the current flowing through the resistor 44 and the current $I_{c1}$ are equal to each other, the collector current $I_s$ of the transistor 42 is given by $$I_s = I_{c1} - I_{c2} \tag{38}$$

By substituting the equations (36) and (37), the above equation (38) is rearranged as $$I_s = \frac{V_{BE}}{Ra} - \frac{V_{BE} + R_E \cdot I_E}{Rb} \tag{39}$$

$$= \left(\frac{1}{Ra} - \frac{1}{Rb}\right) \cdot V_{BE} - \frac{R_E \cdot I_E}{Rb}$$

Taking the voltage $V_{BE}$ as $$V_{BE} = \beta \cdot R_E \cdot I_E + V_D \tag{40}$$

and substituting the equation (40) into the equation (39), the equation (41) is derived.

$$I_s = \left(\frac{1}{Ra} - \frac{1}{Rb}\right) \cdot V_D + \left\{\beta\left(\frac{1}{Ra} - \frac{1}{Rb}\right) - \frac{1}{Rb}\right\} \cdot R_E \cdot I_E \tag{41}$$

The introduction of the equation (40) in the analysis of the circuit is the same concept as done in the equation (9) above. Here, the value of the respective resistors Ra and Rb is chosen to meet a condition $$\beta \cdot \left(\frac{1}{Ra} - \frac{1}{Rb}\right) = \frac{1}{Rb},$$

then the equation (41) is expressed as $$I_s = \left(\frac{1}{Ra} - \frac{1}{Rb}\right) \cdot V_D = \frac{1}{\beta \cdot Rb} \cdot V_D \tag{42}$$

From the equation (42) above, it is readily understood that the current $I_s$ is proportionate to only the distortion voltage $V_D$ (distortion component) contained in the base-emitter voltage $V_{BE}$. Accordingly, the voltage generated across the resistor 14 is given by $$e_s = R_s \cdot I_s = \frac{R_s}{\beta \cdot Rb} \cdot V_D \tag{43}$$

Since the following equation is established in this circuit, $$e_i + e_s = V_{BE} + R_E \cdot I_E + e_o \tag{44}$$

by substituting the equation (40) and (43) into the above equation (44), the relation between the driving voltage $e_i$ and the output voltage $e_o$ is given by $$e_i + \frac{R_s}{\beta \cdot Rb} \cdot V_D = V_D + (1 + \beta) \cdot R_E \cdot I_E + e_o \tag{45}$$

If the value of the resistor $R_s$ is set to have a relation $R_s/(\beta \cdot Rb) = 1$, The driving voltage $e_i$ and the output voltage $e_o$ is fully proportionate to each other, that is, the distortion component is fully cancelled out.

Figure 15:
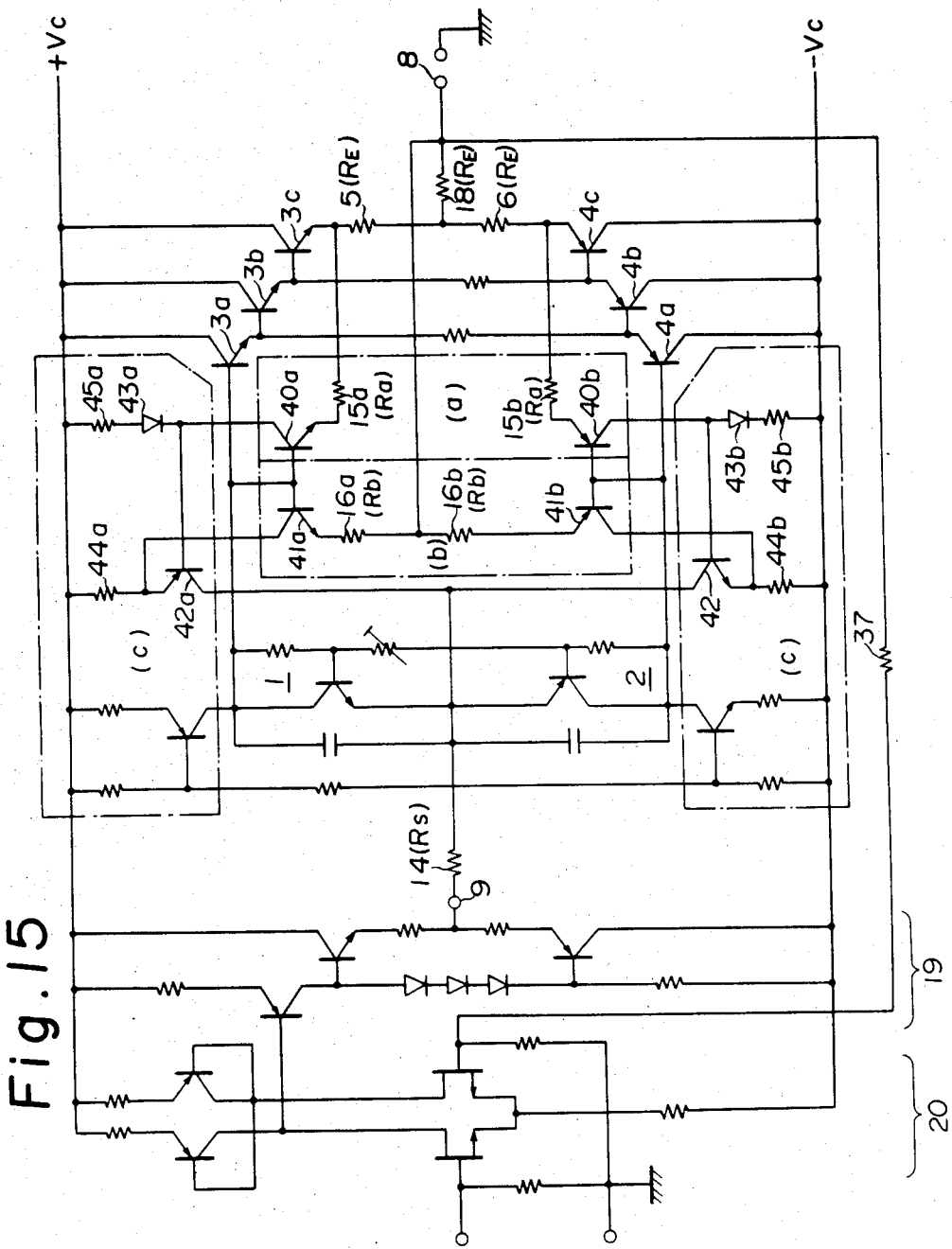
FIG. 15 shows a concrete circuit arrangement of the fourth embodiment of the invention.

A concrete circuit diagram of a push-pull amplifier incorporating the fourth embodiment as above is shown in FIG. 15, wherein identical reference numerals have been used to designate corresponding parts of FIG. 14. In this circuit, negative feedback is provided to a preamplifier circuit 20 from the output terminal 8 through a resistor 37. As a result, the distortion reduction effect is enhanced in the overall circuitry.

Figure 16:
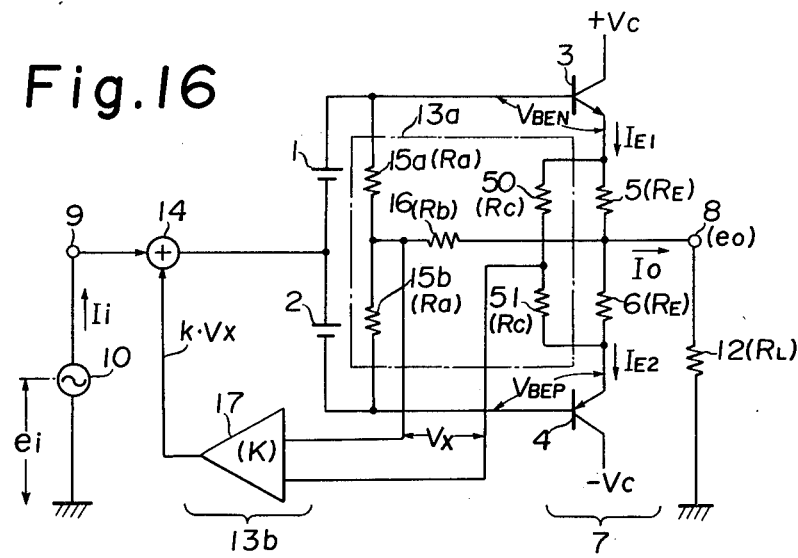
FIG. 16 shows a circuit arrangement of a fifth embodiment of the invention.

FIG. 16 shows a circuit diagram of a fifth embodiment of the amplifier according to the invention. The difference between this embodiment and the first through fourth embodiments is the construction of the distortion detection circuit and addition circuit.

In FIG. 16, transistors 3 and 4 with emitter resistors 5 and 6 (both at the same value $R_E$) connected to the respective emitters thereof are supplied with bias sources 1 and 2 to constitute a class-B push-pull amplifier circuit 7. Resistors 15a and 15b (both at the same value of Ra) are connected in series between the respective bases of the transistors 3 and 4 with the connection point therebetween connected to the output terminal 8 through a resistor 16 (value Rb), the connection point of the emitter resistors 5 and 6 being also connected to the output terminal 8. Resistors 50 and 51 (both at the same value of Rc) are connected in series between the respective emitters of the transistors 3 and 4. The above resistors 15a, 15b, 16, 50 and 51 constitutes a distortion detection section 13a, wherein the voltage $V_x$ appearing between the two connection points of the resistors 15a, 15b and the emitter resistors 5, 6 is applied to the input of the next stage, that is, a differential amplifier 17 which constitute a distortion section 13b. With such a circuit configuration, if the resistance values of the resistors 5, 6, 15a, 15b, 16, 50 and 51 are chosen to meet the condition Ra, Rb, Rc>>$R_E$, the voltage $V_x$ is $$V_x = \frac{Rb(V_{BEN} + R_E \cdot I_E - V_{BEP} - R_E \cdot I_{E2})}{(\frac{1}{2} Ra + Rb)} - \frac{R_E \cdot I_{E1} - R_E \cdot I_{E2}}{2} \quad (46)$$

Since the output current $I_0$ and the current $I_{E1}$, $I_{E2}$ of the respective transistors 3 and 4 are defined by $$I_o = I_{E1} - I_{E2} \quad (47)$$

then the equation (46) is written in $$V_x = \frac{2Rb}{Ra + 2Rb} \cdot (V_{BEN} - V_{BEP}) + \frac{4Rb - Ra - 2Rb}{2(Ra + 2Rb)} \cdot R_E \cdot I_o \quad (48)$$

$$= \frac{2Rb}{Ra + 2Rb} \cdot (V_{BEN} - V_{BEP}) + \frac{2Rb - Ra}{2(Ra + 2Rb)} \cdot R_E \cdot I_o$$

The voltage ($V_{BEN} - V_{BEP}$) can be represented as ($\beta \cdot R_E \cdot I_o + V_D$) as shown in the equation (16), then the equation (48) becomes $$V_x = \frac{2Rb}{Ra + 2Rb} \cdot (\beta \cdot R_E \cdot I_o + V_D) + \frac{2Rb - Ra}{2(Ra + 2Rb) \cdot R_E \cdot I_o} \quad (49)$$

$$= \frac{2Rb}{Ra + 2Rb} \cdot V_D + \frac{2Rb(2\beta + 1) - Ra}{2(Ra + 2Rb)} \cdot R_E \cdot I_o$$

Assuming the resistance values Ra and Rb suffice the relation $2Rb(2\beta+1)=Ra$, the above equation (49) yields $$V_x = \frac{2Rb}{Ra + 2Rb} \cdot V_D = \frac{2Rb}{2Rb(2\beta + 1) + 2Rb} \cdot V_D \quad (50)$$

$$= \frac{V_D}{2(1 + \beta)}$$

The above equation indicates that the voltage $V_x$ is exactly proportionate only to the distortion voltage $V_D$. In the circuit configuration of the embodiment shown in FIG. 16, the following equation may be established $$e_i + K \cdot V_x = V_{BEN} + R_E \cdot I_{E1} - V_{BEP} - R_E \cdot I_{E2} + e_o \quad (51)$$

Substituting the equations (16) and (47), the equation (51) may be expressed as $$e_i + K \cdot V_x = V_D + (1 + \beta) \cdot R_E \cdot I_o - e_o \quad (52)$$

Using the equation (52), it follows that $$e_i + \frac{K \cdot V_D}{2(1 + \beta)} = V_D + (1 + \beta) \cdot R_E \cdot I_o + e_o \quad (53)$$

If the gain factor K is set to be $K/2(1+\beta)=1$, then the equation (53) is written in the following form $$e_i = (1 + \beta) \cdot R_E \cdot I_o + e_o \quad (54)$$

From the above equation (54), it is understood that the relation between the driving voltage $e_i$ and the output voltage $e_o$ has no relation to the distortion voltage $V_D$. Thus, the nonlinearity of the base-emitter voltage $V_{BEN}$ and $V_{BEP}$ is fully compensated, and the amplifier circuit 7 is free from distortion.

Figure 17:
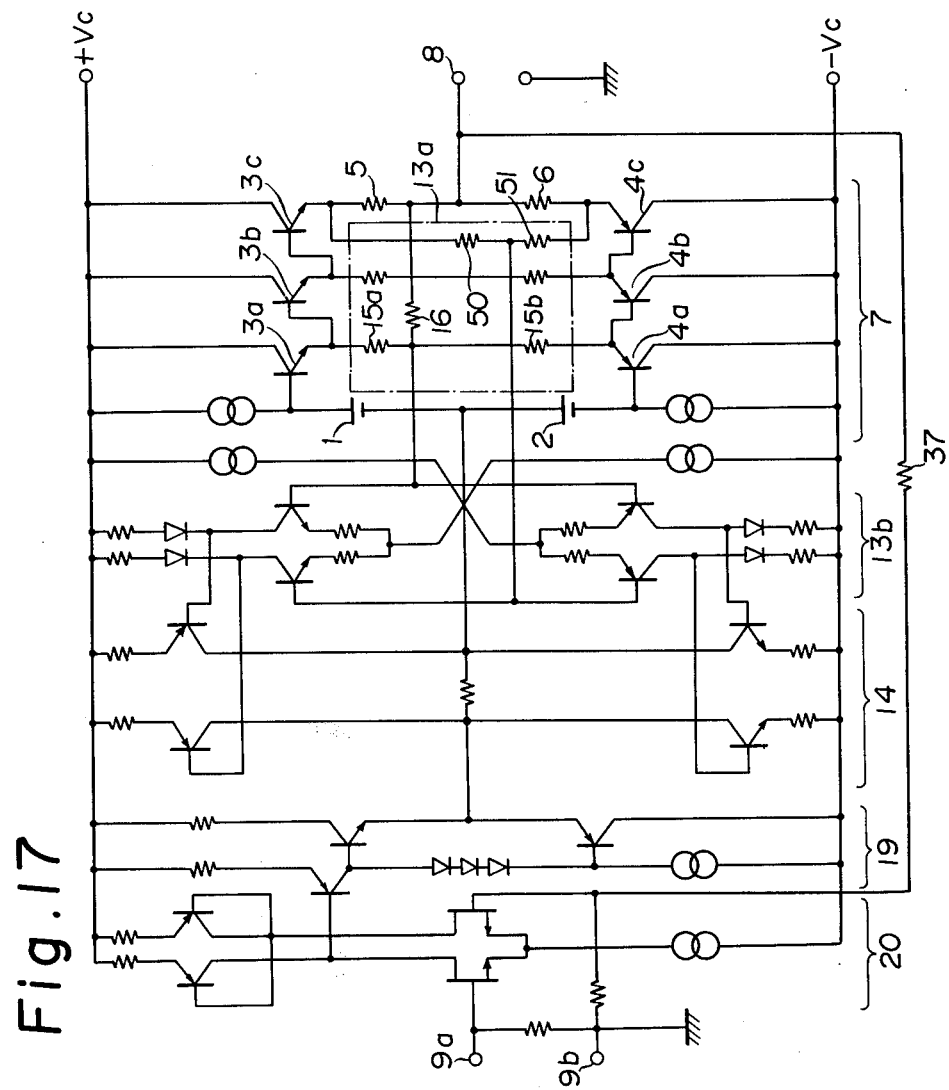
FIG. 17 shows a concrete circuit arrangement of the fifth embodiment of the invention.

A concrete circuit diagram incorporating the fifth embodiment as above is shown in FIG. 17, wherein identical reference numerals have been used to designate corresponding parts of FIG. 16. In this circuit, an amplifier circuit 7 is constructed to be driven by a driver stage amplifier circuit 19 which is preceded by a pre-amplifier circuit 20. Negative feedback from an output terminal 8 to the pre-amplifier 20 is provided through a resistor 37, thereby enhancing the distortion reduction effect in the overall circuitry. Similarly to the other embodiments explained above, since a negligible level of a distortion component is added to the input side of the amplifier, the amplifier stability is less susceptible to the effect of inaccuracy of the level and/or phase of the distortion voltage added to the input side.

Several embodiments of the amplifier according to the invention have been described limiting its application only to amplifiers of an emitter follower type. However, the present invention may be applied to amplifiers of a common emitter type as well. Hereinafter, the invention will be described in connection with common emitter amplifiers.

Figure 18:
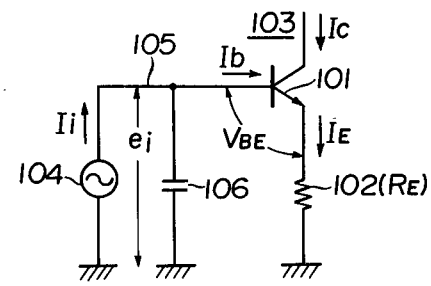
FIGS. 18 through 20 correspond to FIGS. 1 through 3 and are used for illustrating the prior art disadvantages accompanied by a common emitter type amplifier.
Figure 19:
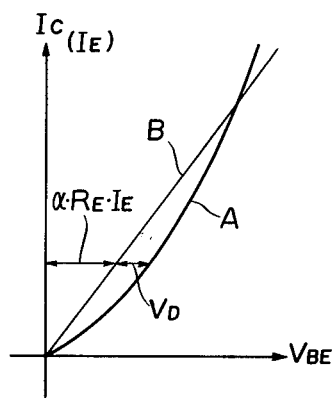

An amplifier shown in FIG. 18 is comprised of a common emitter amplifier circuit 103 including a transistor 101 (NPN type) and an emitter resistor 102 (value $R_E$). The relation between the collector current $I_c$ (or emitter current $I_E$) and the base-emitter voltage $V_{BE}$ is characterized by an exponential function shown in FIG. 19 as a curve A. A driving voltage $e_i$ applied from an input signal 104 to the base of the transistor 101 equals to $V_{BE}+R_E \cdot I_c$, neglecting the base current $I_b$, that is, assuming $I_c=I_E$. If the collector current $I_c$ or the output current of the amplifier is assumed to be free from distortion, the driving voltage $e_i$ is subjected to distortion in accordance with the exponential characteristic of the base-emitter voltage $V_{BE}$. The voltage distortion of the driving voltage $e_i$ causes charge and discharge currents to flow through a capacitance 106 formed between a signal path 105 to the base of the transistor 101 and ground, so that the voltage distortion further generates a current distortion in the input signal 104. Similarly to the above, if the collector current $I_c$ is assumed to be free from distortion, the base current $I_b$ is also subjected to distortion, though the amount of distortion is small due to a relatively fair linearity of a current gain $h_{FE}$ of the transistor.

Figure 20:
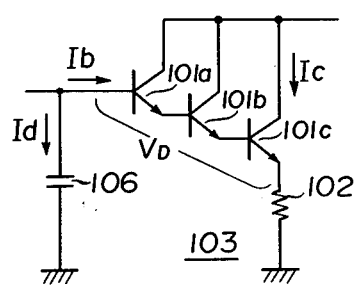

The effect of voltage distortion will be explained in connection with the common emitter amplifier circuit 103 which employs three transistors connected in a Darlington fashion in order to reduce the distortion in the base current $I_b$. In FIG. 20, a common emitter amplifier circuit 103 is comprised of three transistors 101a, 101b and 101c (NPN type) of a Darlington configuration and an emitter resistor 102 connected between the emitter of the transistor 101c and ground. In the common emitter amplifier circuit 103, it is assumed that the value of respective current gain $h_{FE}$ of the transistors 101a, 101b and 101c is "100", the value of the capacitance 106 is 47 pF, and the value of the emitter resistor 102 is 8Ω. At this condition, in order to obtain the output current of 10 A in peak value at 100 kHz, the peak base current $I_b$ is $$I_b = \frac{10(A)}{100^3} = 10 \times 10^{-6}(A) = 10(\mu A)$$

If the distortion voltage of 1 V is assumed to be generated between the base of the transistor 101a and the emitter of the transistor 101c, the charging current $I_d$ forced to flow through the capacitance 106 is given by $$I_d = \frac{1}{(2\pi \times 47 \times 10^{-12} \times 100 \times 10^3)^{-1}}(A) = 29.5(\mu A)$$

As seen from the above equations, in order to reduce the distortion in a common emitter amplifier circuit, it is also important to eliminate, at first, voltage distortion rather than to increase the number of transistors to be connected in a Darlington fashion. Thus, in order to reduce both voltage and current distortion, it is also required to eliminate voltage distortion prior to eliminating current distortion.

Figure 21:
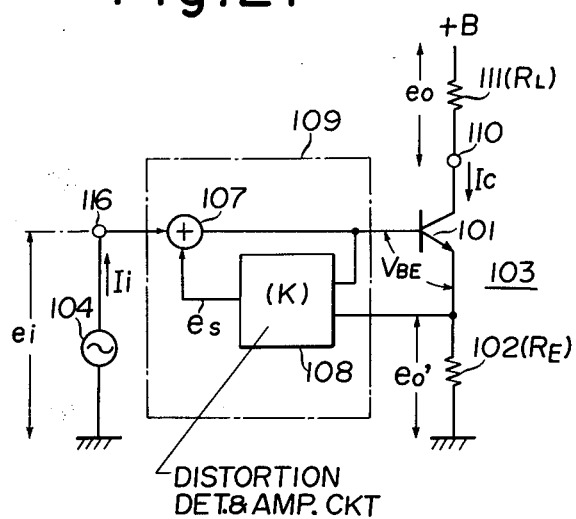
FIG. 21 corresponds to FIG. 4 and shows a basic principle of a common emitter type amplifier according to the invention.

A circuit diagram for illustrating a basic principle of a common emitter amplifier according to the inventin is shown in FIG. 21, wherein identical reference numerals have been used to designate corresponding parts of FIG. 18. In FIG. 21, a driving voltage $e_i$ from an input signal 104 is applied to an input terminal 116. A voltage addition circuit 107 is connected between the input terminal 116 and the base of a transistor 101. A distortion detection and amplification section 108 detects a base-emitter voltage $V_{BE}$ and amplifies by a gain factor K to output the K multiplied base-emitter voltage $V_{BE}$. This output voltage $e_s$ of the distortion detection and amplification section 108 is supplied to the voltage addition circuit 107. The distortion detection and amplification section 108 and the voltage addition circuit 107 constitute a distortion cancellation circuit 109. The collector of the transistor 101 is connected via an output terminal 110 to one terminal of a resistor 111 (value $R_L$), the other terminal of the resistor 111 being connected to a positive power source +B.

With such a circuit configuration, representing the voltage appearing across the resistor 111 as $e_o$, and the voltage across the resistor 102 as $e'_o$, then the relation among the driving voltage $e_i$, output voltage $e_s$ of the distortion detection and amplification section, base-emitter voltages $V_{BE}$, and voltage $e'_o$ is given by $$e_i + e_s = V_{BE} + e'_o \tag{55}$$

The base-emitter voltage $V_{BE}$ can be written in a following form taking a mutual conductance of the transistor 101 as $g_m$.

$$V_{BE} = 1/g_m \cdot e'_o / R_E \tag{56}$$

Then, the voltage $e_s$ is expressed as $$e_s = K \cdot V_{BE} = K/g_m \cdot e'_o / R_E \tag{57}$$

Substituting the above equations (56) and (57) into the equation (55), the result is $$e_i = e_o\left(1 + \frac{1}{g_m \cdot R_E} - \frac{K}{g_m \cdot R_E}\right) \tag{58}$$

When neglecting the base current of the transistor 101, the voltage $e_s$ may be expressed as $$e_o = -R_L/R_E \cdot e'_o \tag{59}$$

From the equations (59) and (58), the transfer characteristic of the amplifier shown in FIG. 21, is derived $$A_v = \frac{e_o}{e_i} = -\frac{R_L}{R_E} \cdot \left(1 + \frac{1}{g_m \cdot R_E} - \frac{K}{g_m \cdot R_E}\right)^{-1} \tag{60}$$

As is readily understood from the equation (60), if the gain factor K is set to be "1", the transfer gain $A_v$ equals to $(-R_L/R_E)$ and is independent of the mutual conductance $g_m$ and hence the base-emitter voltage $V_{BE}$. Thus, the distortion of the amplifier is completely cancelled out. Since no current flows into and out of the voltage addition circuit 107, the relation $I_c = h_{FE} \cdot I_i$ still remains unchanged between the driving current $I_i$ flowing via the input signal terminal 116 and the collector current $I_c$ of the transistor 101. This is the same as in the case of the amplifier without the distortion cancellation circuit 109. It is also appreciated that the amplifier with a transfer gain $$A_v = \left[-\frac{R_E}{R_L}\left(1 + \frac{1}{g_m \cdot R_E}\right)\right]^{-1}$$

at K = "0", has the same amount of distortion as that of the conventional one without the distortion cancellation circuit 109, and that the amplifier with a transfer gain $$A_v = \left[-\frac{R_E}{R_L}\left(1 - \frac{1}{g_m \cdot R_E}\right)\right]^{-}$$

at K = "2", has the distortion equal in amount and inverse in phase as the conventional one.

In the above basic principle of the amplifier according to the invention, the base-emitter voltage $V_{BE}$ itself is directly added to the driving voltage $e_i$ after multiplied by the gain factor K. In practice, it is noted, however, that using only a distortion component contained in the $V_{BE}$ which also contains a linear component, is sufficient for cancelling out the distortion generated across the base-emitter voltage $V_{BE}$, and is effective for the improvement of the stability of the amplifier.

Figure 22:
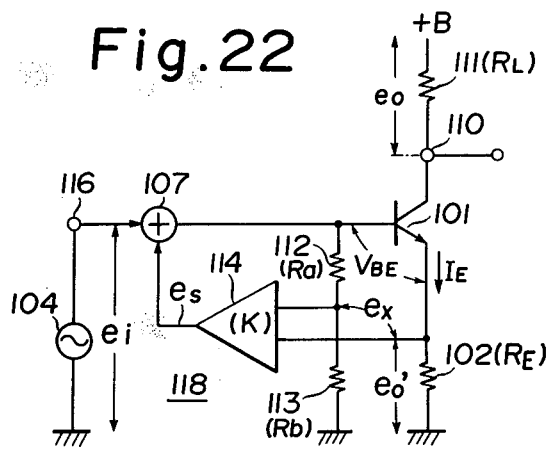
FIG. 22 corresponds to FIG. 5 and shows a basic circuit configuration of a common emitter type amplifier.

A basic circuit configuration of a common emitter amplifier is described below which uses only the distortion component of a base-emitter voltage $V_{BE}$. In FIG. 22, identical numerals have been used to designate corresponding parts of FIG. 21, and the description thereof is omitted for the purpose of brevity. A resistor 112 (value Ra) and resistor 113 (value Rb) are connected in series between the base of a transistor 101 and ground. A differential amplifier 114 with a gain factor K amplifies by a factor K a voltage $e_x$ between the connection point of the resistors 112 and 113, and the emitter of the transistor 101.

With such a circuit construction, the voltage $e_x$ applied to the input of the differential amplifier 114 is expresses as $$e_x = \frac{(V_{BE} + R_E \cdot I_E)Rb}{Ra + Rb} - R_E \cdot I_E \quad (61)$$

$$= \frac{V_{BE} \cdot Rb}{Ra + Rb} - \frac{Ra}{Ra + Rb} \cdot R_E \cdot I_E$$

where $I_E$ represents the emitter current of the transistor 101. Since the base-emitter voltage $V_{BE}$ may be divided into two parts, that is, one being a linear component ($\alpha \cdot R_E \cdot I_E$ represented by a straight line B) and the other being a distortion component $V_D$, the voltage $V_{BE}$ is defined by $$V_{BE} = \alpha \cdot R_E \cdot I_E + V_D \quad (62)$$

Substituting the equation (62) into the equation (61), the result is $$e_x = \frac{Rb}{Ra + Rb} \cdot V_D + \frac{\alpha \cdot Rb = Ra}{Ra + Rb} \cdot R_E \cdot I_E \quad (63)$$

If the values of Ra, Rb and $\alpha$ are chosen to be $Ra = \alpha \cdot Rb$, then the equation (63) is expressed as $$e_x = Rb/(Ra + Rb) \cdot V_D \quad (64)$$

The above equation (64) indicates that the voltage $e_s$ is proportionate to the distortion component $V_D$. In the basic circuit described above, the following equation may also be established in connection with the voltage $e_x$, driving voltage $e_i$, base-emitter voltage $V_{BE}$, and voltage $e'_o$ $$e_i + K \cdot e_x = V_{BE} + e'_o \quad (65)$$

Substituting the equations (62) and (64) into the equation (65), the result is $$e_i + \frac{K \cdot Rb}{Ra + Rb} \cdot V_D = V_D + \alpha \cdot R_E \cdot I_E + e_o \quad (66)$$

Incorporating a relation $R_E \cdot I_E = e'_o$ into the equation (66) yields $$e_i + \frac{K \cdot Rb}{Ra + Rb} \cdot V_D = V_D + (1 + \alpha)e'_o \quad (67)$$

If the gain factor K is set to be $K = (Ra + Rb)/Rb$, then the equation (67) is expressed as $$e_i = (1 + \alpha)e'_o \quad (68)$$

The above voltage $e'_o$ is expressed as $e_o = -R_E/R_L \cdot e_o$, then the equation (68) becomes $$e_i = \frac{R_E \cdot (1 + \alpha)}{R_L} \cdot e_o \quad (69)$$

The equation indicates that the driving voltage $e_i$ is completely proportionate to the voltage $e_o$.

As seen from the above circuit analysis, it is noted that the distortion is effectively cancelled out by using only the distortion component in the base-emitter voltage. Moreover, since the distortion component is considerably small compared with the signal level, the amplifier stability remains high irrespective of the phase variation or the like of the distortion voltage, also.

What is claimed is:

1. An amplifier comprising:
   a first input terminal to which a first input signal to be amplified is applied;
   a first output terminal from which an amplified first output signal is derived;
   amplification means having a second input terminal and a second output terminal for amplifying a second input signal appearing at said second input terminal and producing at said second output terminal an amplified second output signal therefrom, said amplified second output signal being fed to said first output terminal;
   distortion detection means for detecting, in accordance with said second input signal and said amplified second output signal, distortion generated in said amplification means and producing a third output signal therefrom; and
   addition means connected between said first input terminal and said second input terminal for adding said third output signal to said first input signal in order to feed the resultant added signal, which is said second input signal, to said second input terminal of said amplification means; in which
   said distortion detection means comprises a distortion detection section and an amplification section,
   said distortion detection section comprising first and second resistor means connected in series with each other between said second input terminal and said first output terminal, and third resistor means connected between said second output terminal and said first output terminal, wherein a path of said amplification means between said second input and output terminals and said first, second and third resistor means constitutes a bridge circuit,
   said amplification section receiving a first signal component which varies non-linearly in accordance with the second input signal and appears at the connection point of said third resistor means and said second output terminal, and a second signal component which varies linearly in accordance with the second input signal and appears at the connection point of said first and second resistor means, and discriminating said first signal component from said second signal component to produce only a distortion component of said second output signal as the third output signal.

2. An amplifier according to claim 1, in which said amplification means comprises a first transistor having a base, an emitter and a collector whose base serves as said second input terminal, the emitter serving as said second output terminal.

3. An amplifier comprising:
   a first input terminal to which a first input signal to be amplified is applied;
   a first output terminal from which an amplified first output signal is derived;
   amplification means having a second input terminal and a second output terminal for amplifying a second input signal appearing at said second input terminal and producing at said second output terminal an amplified second output signal therefrom, said amplified second output signal being fed to said first output terminal;

distortion detection means for detecting, in accordance with said second input signal and said amplified second output signal, distortion generated in said amplification means and producing a third output signal therefrom; and addition means connected between said first input terminal and said second input terminal for adding said third output signal to said first input signal in order to feed the resultant added signal, which is said second input signal, to said second input terminal of said amplification means; in which said amplification means comprises a complementary push-pull circuit having a second transistor provided at a positive power supply side and a third transistor provided at a negative power supply side; and said distortion detection means comprises a distortion detection section and an amplification section, said distortion detection section comprising:

fourth and fifth resistor means connected in series between the bases of said second and third transistors;

sixth resistor means connected between said second output terminals of said amplification means and said first output terminals; and seventh resistor means connected between the connection point of said fourth and fifth resistor means and said first output terminal; and said amplification section receiving a first signal component which varies non-linearly in accordance with the second input signal and appears at the connection point of said sixth resistor means and said second output terminal, and a second signal component which varies linearly in accordance with the second input signal and appears at the connection point of said fourth and fifth resistor means, and discriminating said first signal component from said second signal component to produce only a distortion component of said second output signal as the third output signal.

4. An amplifier comprising:

a first input terminal to which a first input signal to be amplified is applied:

a first output terminal from which an amplified first output signal is derived;

amplification means having a second input terminal and a second output terminal for amplifying a second input signal appearing at said second input terminal and producing at said second output terminal an amplified second output signal therefrom, said amplified second output signal being fed to said first output terminal;

distortion detection means for detecting, in accordance with said second input signal and said amplified second output signal, distortion generated in said amplification means and producing a third output signal therefrom; and addition means connected between said first input terminal and said second input terminal for adding said third output signal to said first input signal in order to feed the resultant added signal, which is said second input signal, to said second input terminal of said amplification means; in which said amplification means comprises a complementary push-pull circuit having a fourth transistor provided at a positive power supply side and a fifth transistor provided at a negative power supply side; and said distortion detection means comprises a distortion detection section and an amplification section, said distortion detection section comprising:

eighth and ninth resistor means connected in series between the bases of said fourth and fifth transistors;

tenth and eleventh resistor means connected in series between the emitters of said fourth and fifth transistors; and twelfth resistor means connected between the connection point of said eighth and ninth resistor means and said second output terminal which is connected to said first output terminal; and said amplification section receiving a first signal component which varies non-linearly in accordance with the second input signal and appears at the connection point of said tenth and eleventh resistor means, and a second signal component which varies linearly in accordance with the second input signal and appears at the connection point of said eighth and ninth resistor means, and discriminating said first signal component from said second signal component to produce only a distortion component of said second output signal as the third output signal.

5. An amplifier according to any one of claims 3 and 4, in which said amplifier further comprises first driver stage amplification means connected between said first input terminal and said addition means for amplifying said first input signal applied to said first input terminal;

said amplification section of said distortion detection means comprises at least one differential amplifier for amplifying said distortion derived from said distortion detection section; and said addition means comprises thirteenth resistor means connected between said driver stage amplification means and said amplification means, a current flowing through said thirteenth being controlled by an output of said differential amplifier where the first input signal amplified by said driver stage amplification means and the signal corresponding to said distortion are added together.

6. An amplifier according to any one of claims 3 and 4, in which said amplifier further comprises second driver stage amplification means connected between said first input terminal and said addition means for amplifying said first input signal applied to said first input terminal;

said amplification section of said distortion detection means comprises at least one differential amplifier for amplifying said distortion derived from said distortion detection section; and said addition means comprises at least one current mirror circuit for converting the distortion amplified by said amplification section to a corresponding current, and fourteenth resistor means connected between said driver stage amplification means and said amplification means, whereby said current from said current mirror circuit flows through said fourteenth resistor means where the first input signal amplified by said driver stage amplification means and the signal corresponding to said corresponding output current are added together.

7. An amplifier according to claim 6, in which said distortion amplification means and said addition means are power-supplied by a floating power supply.

8. An amplifier according to claim 1, in which negative feedback means is provided between said first output terminal and an input side of said amplifier.

9. An amplifier according to claim 8, in which said amplifier further comprises stage amplification means connected between said first input terminal and said addition means for amplifying said first input signal applied to said first input terminal and second negative feedback means connected between the input side of said amplifier and an output side of said driver stage amplification means, said first and second negative feedback means being selectively changed over by an operation of a manipulator.

10. An amplifier according to claim 1, in which said amplification means comprises a common-emitter type transistor having a base, an emitter and a collector whose base serves as said second input terminal, the emitter serving as said second output terminal, and said collector being coupled to a load of said amplifier.

* * * * *